(12) United States Patent
Kadono et al.

(10) Patent No.: US 9,496,139 B2
(45) Date of Patent: *Nov. 15, 2016

(54) METHOD OF PRODUCING SEMICONDUCTOR EPITAXIAL WAFER, SEMICONDUCTOR EPITAXIAL WAFER, AND METHOD OF PRODUCING SOLID-STATE IMAGE SENSING DEVICE

(75) Inventors: Takeshi Kadono, Minato-ku (JP); Kazunari Kurita, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 42 days.

This patent is subject to a terminal disclaimer.

(21) Appl. No.: 14/116,318

(22) PCT Filed: Mar. 19, 2012

(86) PCT No.: PCT/JP2012/001892
§ 371 (c)(1),
(2), (4) Date: Nov. 7, 2013

(87) PCT Pub. No.: WO2012/157162
PCT Pub. Date: Nov. 22, 2012

(65) Prior Publication Data
US 2014/0080247 A1    Mar. 20, 2014

(30) Foreign Application Priority Data

May 13, 2011    (JP) .................................. 2011-107931
May 13, 2011    (JP) .................................. 2011-107943

(51) Int. Cl.
*H01L 21/02*      (2006.01)
*H01L 27/146*     (2006.01)
(Continued)

(52) U.S. Cl.
CPC ... *H01L 21/02631* (2013.01); *H01L 21/02381* (2013.01); *H01L 21/02439* (2013.01);
(Continued)

(58) Field of Classification Search
CPC .................. H01L 21/02439; H01L 21/02532; H01L 21/02631; H01L 21/02658; H01L 21/26566; H01L 21/3221; H01L 27/14687; H01L 29/36
See application file for complete search history.

(56) References Cited

U.S. PATENT DOCUMENTS 5,024,723 A * 6/1991 Goesele et al. ............... 438/459
5,734,195 A   3/1998 Takizawa
(Continued)

FOREIGN PATENT DOCUMENTS

CN    101313395 A    11/2008
JP    6-338507 A     12/1994
(Continued)

OTHER PUBLICATIONS

Notification of Reasons for Refusal mailed Sep. 30, 2014, issued in corresponding Japanese Patent Application No. 2013-514962, 12 pages.
(Continued)

*Primary Examiner* — Thanhha Pham
(74) *Attorney, Agent, or Firm* — Christensen O'Connor Johnson Kindness PLLC

(57) ABSTRACT

The present invention provides a method of more efficiently producing a semiconductor epitaxial wafer, which can suppress metal contamination by achieving higher gettering capability.

A method of producing a semiconductor epitaxial wafer 100 according to the present invention includes a first step of irradiating a semiconductor wafer 10 with cluster ions 16 to form a modifying layer 18 formed from a constituent element of the cluster ions 16 in a surface portion 10A of the semiconductor wafer; and a second step of forming an epitaxial layer 20 on the modifying layer 18 of the semiconductor wafer 10.

9 Claims, 11 Drawing Sheets

(51) Int. Cl.
   *H01L 29/36*      (2006.01)
   *H01L 21/265*     (2006.01)
   *H01L 21/322*     (2006.01)

(52) U.S. Cl.
   CPC ... *H01L21/02532* (2013.01); *H01L 21/02658* (2013.01); *H01L 21/26566* (2013.01); *H01L 21/3221* (2013.01); *H01L 27/14687* (2013.01); *H01L 29/36* (2013.01)

(56) References Cited

U.S. PATENT DOCUMENTS

| | | | |
|---|---|---|---|
| 7,666,771 | B2 | 2/2010 | Krull |
| 2004/0004271 | A1* | 1/2004 | Fukuda et al. ............... 257/616 |

FOREIGN PATENT DOCUMENTS

| | | | |
|---|---|---|---|
| JP | 2007-317760 | A | 12/2007 |
| JP | 2008-294245 | A | 12/2008 |
| JP | 2008-311418 | A | 12/2008 |
| JP | 2009-518869 | A | 5/2009 |
| JP | 2008-311418 | A | 8/2009 |
| JP | 2009-540531 | A | 11/2009 |
| JP | 2010-40864 | A | 2/2010 |
| JP | 2010-114409 | A | 5/2010 |
| JP | 2011-54763 | A | 3/2011 |
| JP | 2011-54879 | A | 3/2011 |
| JP | 2011-151318 | A | 8/2011 |
| JP | 2012-59849 | A | 3/2012 |
| WO | 2008/029918 | A1 | 3/2008 |

OTHER PUBLICATIONS

Notification of Reasons for Refusal mailed Feb. 4, 2014, issued in corresponding Japanese Patent Application No. 2013-514962, 6 pages.

Rudawski, N.G., et al., "Amorphization and Solid-Phase Epitaxial Growth of C-Cluster Ion-Implanted Si," Journal of Electronic Materials 38(9):1926-1930, Sep. 2009.

International Search Report mailed Jun. 5, 2012, issued in corresponding International Application No. PCT/JP2012/001892, filed Mar. 19, 2012, 4 pages.

Preliminary Notice of First Office Action mailed Sep. 29, 2014, issued in corresponding Taiwanese Patent Application No. 101113620, filed Jul. 5, 2012, 9 pages.

Chinese Patent Office Notification of First Office Action dated Apr. 3, 2015, issued in corresponding Chinese Patent Application No. 201280023592.8, filed Mar. 19, 2012, 18 pages Korean Patent Office Notification of Reasons for Refusal dated Apr. 7, 2015, issued in corresponding PCT Patent Application No. 2013-7032894, filed Mar. 19, 2012, 11 pages.

Chinese Patent Office Office Action Summary (Second) dated Sep. 11, 2015, issued in corresponding Chinese Patent Application No. 201280023592.8, filed Mar. 19, 2012, 7 pages.

Korean Patent Office Official Decision of Refusal dated Aug. 1, 2015, issued in corresponding Korean Patent Application No. 10-2013-7032894, filed Mar. 19, 2012, 8 pages.

Korean Patent Office Appeal Decision dated Feb. 22, 2016, issued in corresponding Korean Patent Application No. 10-2013-7032894, filed Mar. 19, 2012, 21 pages.

* cited by examiner

FIG. 7
| | Example 1-2 | Comparative Example 1-2 |
|---|---|---|
| LPD-Map | 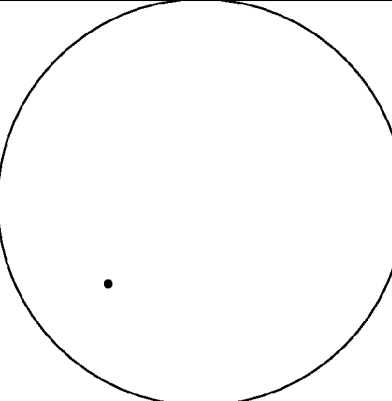 | 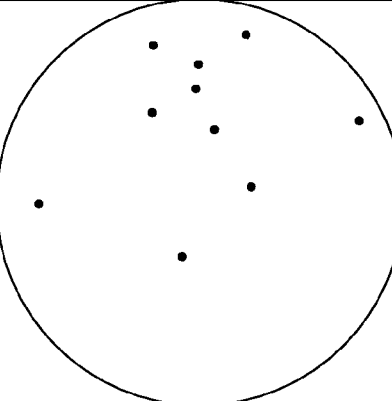 |
| LPD (Number/Wafer) | 1 | 10 |

FIG. 11
| | Example 2-2 | Comparative Example 2-2 |
|---|---|---|
| LPD-Map | 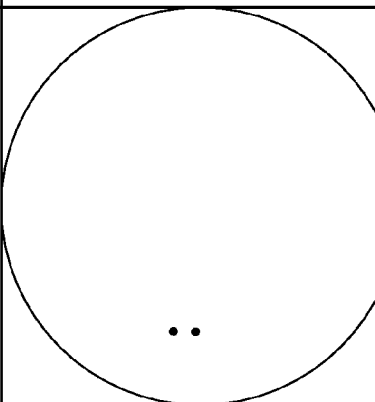 | 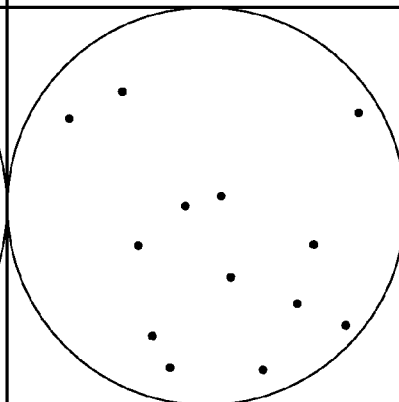 |
| LPD (Number/Wafer) | 2 | 13 | ns
METHOD OF PRODUCING SEMICONDUCTOR EPITAXIAL WAFER, SEMICONDUCTOR EPITAXIAL WAFER, AND METHOD OF PRODUCING SOLID-STATE IMAGE SENSING DEVICE

TECHNICAL FIELD

The present invention relates to a method of producing a semiconductor epitaxial wafer, a semiconductor epitaxial wafer, and a method of producing a solid-state image sensing device. The present invention particularly relates to a method of more efficiently producing a semiconductor epitaxial wafer, which can suppress metal contamination by achieving higher gettering capability.

BACKGROUND ART

Metal contamination is one of the factors that deteriorate the characteristics of a semiconductor device. For example, for a back-illuminated solid-state image sensing device, metal mixed into a semiconductor epitaxial wafer to be a substrate of the device causes increased dark current in the solid-state image sensing device, and results in formation of defects referred to as white spot defects. In recent years, back-illuminated solid-state image sensing devices have been widely used in digital video cameras and mobile phones such as smartphones, because they can directly receive light from the outside, and take sharper images or motion pictures even in dark places and the like due to the fact that a wiring layer and the like thereof are disposed at a lower layer than a sensor section. Therefore, it is desirable to reduce white spot defects as much as possible.

Mixing of metal into a wafer mainly occurs in a process of producing a semiconductor epitaxial wafer and a process of producing a solid-state image sensing device (device fabrication process). Metal contamination in the former process of producing a semiconductor epitaxial wafer may be due to heavy metal particles from components of an epitaxial growth furnace, or heavy metal particles caused by metal corrosion of piping materials of the furnace due to chlorine-based gas used in epitaxial growth in the furnace. In recent years, such metal contaminations have been reduced to some extent by replacing components of epitaxial growth furnaces with highly corrosion resistant materials, but not to a sufficient extent. On the other hand, in the latter process of producing a solid-state image sensing device, heavy metal contamination of semiconductor substrates would occur in process steps such as ion implantation, diffusion, and oxidizing heat treatment in the producing process.

For these reasons, conventionally, heavy metal contamination of semiconductor epitaxial wafers has been avoided by forming, in the semiconductor wafer, a gettering sink for trapping the metal, or using a substrate, such as a high boron concentration substrate, having high ability to trap the metal (gettering capability).

In general, a gettering sink is formed in a semiconductor wafer by an intrinsic gettering (IG) method in which an oxygen precipitate (commonly called a silicon oxide precipitate, and also called BMD: bulk micro defect) or dislocation that are crystal defects is formed within the semiconductor wafer, or an extrinsic gettering (EG) method in which the gettering sink is formed on the rear surface of the semiconductor wafer.

Here, a technique of forming a gettering site in a semiconductor wafer by ion implantation can be given as a technique for gettering heavy metal. JP H06-338507 A (PTL 1) discloses a producing method, by which carbon ions are implanted through a surface of a silicon wafer to form a carbon ion implanted region, and a silicon epitaxial layer is formed on the surface thereby obtaining a silicon epitaxial wafer. In that technique, the carbon ion implanted region functions as a gettering site.

Further, JP 2008-294245 A (PTL 2) discloses a method of forming a carbon implanted layer by implanting carbon ions into a silicon wafer, and then performing heat treatment using an RTA (Rapid Thermal Annealing) apparatus for recovering the crystallinity of the wafer which has been disrupted by the ion implantation, thereby shortening the recovery heat treatment process.

CITATION LIST

Patent Literature

PTL 1: JP H06-338507 A
PTL 2: JP 2008-294245 A

SUMMARY OF INVENTION

Technical Problem

In both of the techniques described in PTL 1 and PTL 2, single ions are implanted in a semiconductor wafer before forming an epitaxial layer. However, according to studies made by the inventors of the present invention, it was found that white spot defects cannot be sufficiently reduced in solid-state image sensing devices produced using semiconductor epitaxial wafers subjected to single-ion implantation, and the semiconductor epitaxial wafers are required to achieve stronger gettering capability.

Further, since implantation of single ions greatly disrupts crystallinity of a semiconductor wafer, it is required to perform heat treatment on the semiconductor wafer for recovering the crystallinity thereof (hereinafter referred to as "recovery heat treatment") at a high temperature for a long time before forming an epitaxial layer. However, a long-time recovery heat treatment at a high temperature affects the improvement in the throughput. In PTL 2, the time for a recovery heat treatment itself is shortened, but the recovery heat treatment is performed using an RTA apparatus separate from the epitaxial apparatus, which also makes it impossible to achieve high throughput.

In view of the above problems, an object of the present invention is to provide a method of more efficiently producing a semiconductor epitaxial wafer, which can suppress metal contamination by achieving higher gettering capability.

Solution to Problem

According to further studies made by the inventors of the present invention, irradiation of an epitaxial layer formed on a semiconductor wafer with cluster ions is advantageous in the following points as compared with implantation of single ions into the epitaxial layer. Specifically, even if irradiation with cluster ions is performed at an acceleration voltage equivalent to the case of single ion implantation, the energy per one atom or one molecule applied to the irradiated semiconductor wafer is lower than in the case of single ion implantation. This results in higher peak concentration in the depth direction profile of the irradiation element, and allows the peak position to approach the surface of the semiconductor wafer. Thus, the gettering capability was found to be improved. Further, it was found that irradiation with cluster ions can reduce damage to crystals as compared with single-ion implantation, which makes it possible to omit recovery heat treatment performed after the ion irradiation. Based on the above findings, the inventors completed the present invention.

Specifically, a method of producing a semiconductor epitaxial wafer according to the present invention characteristically includes a first step of irradiating a semiconductor wafer with cluster ions to form a modifying layer formed from a constituent element of the cluster ions in a surface portion of the semiconductor wafer; and a second step of forming an epitaxial layer on the modifying layer of the semiconductor wafer.

Here, the semiconductor wafer may be a silicon wafer.

Further, the semiconductor wafer may be an epitaxial silicon wafer in which a silicon epitaxial layer is formed on a surface of a silicon wafer. In this case, the modifying layer is formed in a surface portion of the silicon epitaxial layer in the first step.

In the present invention, the second step can be performed after transferring the semiconductor wafer into an epitaxial growth apparatus, without heat treating the semiconductor wafer for recovering the crystallinity after the first step.

Here, the cluster ions preferably contain carbon as a constituent element. More preferably, the cluster ions contain at least two kinds of elements including carbon as constituent elements.

Further, in the first step, the semiconductor wafer can be irradiated with the cluster ions such that the peak of a concentration profile of the constituent element in the depth direction of the modifying layer lies at a depth within 150 nm from the surface of the semiconductor wafer.

The first step is preferably performed under the conditions of: the acceleration voltage of cluster ions is less than 100 keV/Cluster, the cluster size is 100 or less, and the cluster dose is $1 \times 10^{16}$ atoms/cm$^2$ or less. Further, the first step is more preferably performed under the conditions of: the acceleration voltage of cluster ions is 80 keV/Cluster or less, the cluster size is 60 or less, and the cluster dose is $5 \times 10^{13}$ atoms/cm$^2$ or less.

Next, a semiconductor epitaxial wafer according to the present invention includes a semiconductor wafer; a modifying layer formed from a certain element contained as a solid solution in the semiconductor wafer, in a surface portion of the semiconductor wafer; and an epitaxial layer on the modifying layer. The half width of a concentration profile of the certain element in the depth direction of the modifying layer is 100 nm or less.

Here, the semiconductor wafer may be a silicon wafer.

Further, the semiconductor wafer may be an epitaxial silicon wafer in which a silicon epitaxial layer is formed on a surface of a silicon wafer. In this case, the modifying layer is located in a surface portion of the silicon epitaxial layer.

Moreover, the peak of the concentration profile in the modifying layer preferably lies at a depth within 150 nm from the surface of the semiconductor wafer. The peak concentration of the concentration profile in the modifying layer is preferably $1 \times 10^{15}$ atoms/cm$^3$ or more.

Here, the certain element preferably includes carbon. More preferably, the certain element includes at least two kinds of elements including carbon.

In a method of producing a solid-state image sensing device according to the present invention, a solid-state image sensing device is formed on the epitaxial layer located in the surface portion of the epitaxial wafer fabricated by any one of the above producing methods or of any one of the above epitaxial wafers.

Advantageous Effect of Invention

According to the method of producing a semiconductor wafer of the present invention, a semiconductor wafer is irradiated with cluster ions, and a modifying layer is formed from (a) constituent element(s) of the cluster ions in a surface portion of the semiconductor wafer, which allows the modifying layer to achieve higher gettering capability. Thus, a semiconductor epitaxial wafer which makes it possible to suppress metal contamination can be produced. Further, the irradiation with cluster ions can reduce damage to crystals as compared with single-ion implantation, which makes it possible to omit recovery heat treatment performed after the ion irradiation. Thus, the semiconductor epitaxial wafer can be more sufficiently produced.

BRIEF DESCRIPTION OF DRAWINGS

FIG. 7 shows LPD maps of Example 1-2 and Comparative Example 1-2.

FIG. 11 shows LPD maps of Example 2-2 and Comparative Example 2-2.

DESCRIPTION OF EMBODIMENTS

Figure 1:
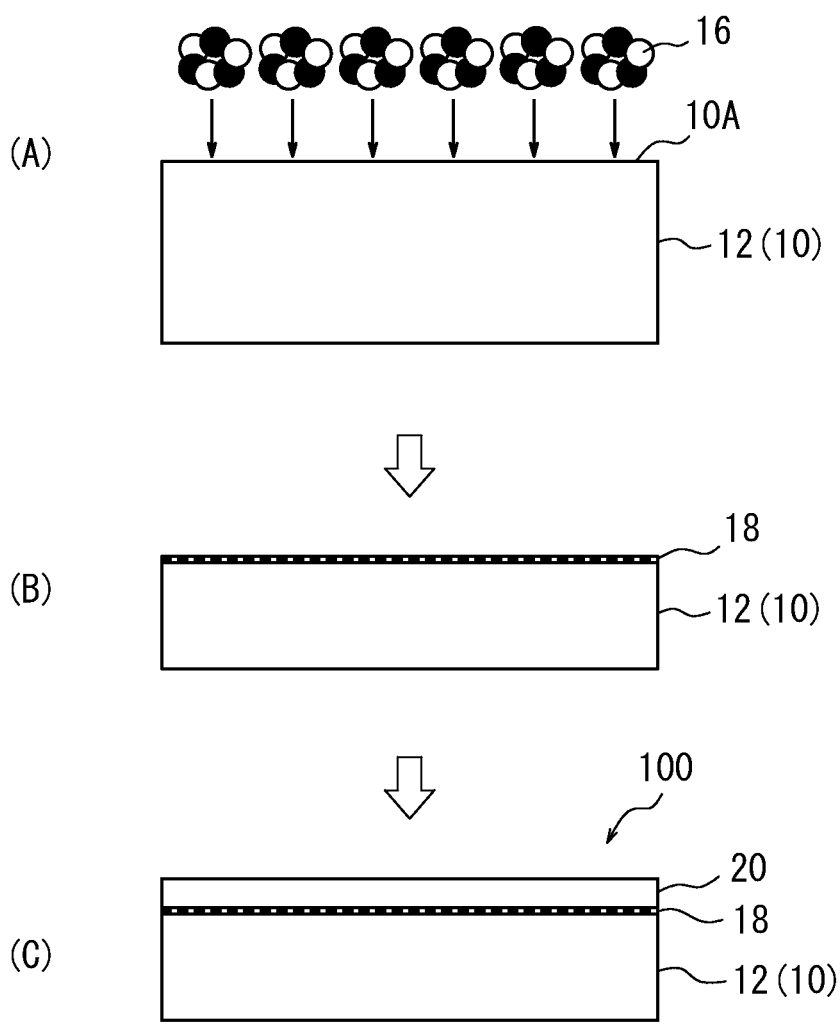
FIGS. 1(A) to 1(C) are schematic cross-sectional views illustrating a method of producing a semiconductor epitaxial wafer 100 according to an embodiment of the present invention.

Embodiments of the present invention will be described below in detail with reference to the drawings. In principle, the same components are denoted by the same reference numeral, and the description will not be repeated. Further, in FIGS. 1(A) to 1(C) and FIGS. 2(A) to 2(D), a first epitaxial layer 14 and a second epitaxial layer 20 are exaggerated with respect to a semiconductor wafer 10 in thickness for the sake of explanation, so the thickness ratio does not conform to the actual ratio.

(Method of Producing Semiconductor Epitaxial Wafer)

A method of producing a semiconductor epitaxial wafer 100 according to a first embodiment of the present invention includes, as shown in FIGS. 1(A) to 1(C), a first step (FIGS. 1(A) and 1(B)) of irradiating a semiconductor wafer 10 with cluster ions 16 to form a modifying layer 18 formed from a constituent element of the cluster ions 16 in a surface portion 10A of the semiconductor wafer 10; and a second step (FIG. 1(C)) of forming an epitaxial layer 20 on the modifying layer 18 of the semiconductor wafer 10. FIG. 1(C) is a schematic cross-sectional view of the semiconductor epitaxial wafer 100 obtained by this producing method.

Examples of the semiconductor wafer 10 include, for example, a bulk single crystal wafer including silicon or a compound semiconductor (GaAs, GaN, or SiC) with no epitaxial layer on the surface thereof. In general, a bulk single crystal silicon wafer is used in cases of producing back-illuminated solid-state image sensing devices. Further, the semiconductor wafer 10 may be prepared by growing a single crystal silicon ingot by the Czochralski process (CZ process) or floating zone melting process (FZ process) and slicing it with a wire saw or the like. Further, carbon and/or nitrogen may be added thereto to achieve higher gettering capability. Furthermore, the semiconductor wafer 10 may be made n-type or p-type by adding certain impurities. The first embodiment shown in FIGS. 1(A) to 1(C) is an example of using a bulk semiconductor wafer 12 with no epitaxial layer on its surface, as the semiconductor wafer 10.

Alternatively, an epitaxial semiconductor wafer in which a semiconductor epitaxial layer (first epitaxial layer) 14 is formed on a surface of the bulk semiconductor wafer 12 as shown in FIG. 2(A), can be given as an example of the semiconductor wafer 10. For example, an epitaxial silicon wafer in which a silicon epitaxial layer is formed on a surface of a bulk single crystal silicon wafer can be given. The silicon epitaxial layer may be formed by CVD process under typical conditions. The first epitaxial layer 14 preferably has a thickness in the range of 0.1 μm to 10 μm, more preferably in the range of 0.2 μm to 5 μm.

A method of producing a semiconductor epitaxial wafer 200 according to a second embodiment of the present invention includes, as shown in FIGS. 2(A) to 2(D), a first step (FIGS. 2(A) to 2(C)) of irradiating a semiconductor wafer 10, in which a first epitaxial layer 14 is formed on a surface (at least one side) of the bulk semiconductor wafer 12, with cluster ions 16 to form a modifying layer 18 formed from a constituent element of the cluster ions 16 in a surface portion 10A of the semiconductor wafer 10 (the surface portion of the first epitaxial layer 14 in this embodiment); and a second step (FIG. 2(D)) of forming an epitaxial layer 20 on the modifying layer 18 of the semiconductor wafer 10. FIG. 2(D) is a schematic cross-sectional view of the semiconductor epitaxial wafer 200 obtained by this producing method.

Here, the step of irradiation with cluster ions shown in FIG. 1(A) and FIG. 2(B) is a characteristic step of the present invention. The technical meaning of employing the characteristic step will be described with the operation and effect. The modifying layer 18 formed as a result of irradiation with the cluster ions 16 is a region where the constituent element of the cluster ions 16 is localized as a solid solution at crystal interstitial positions or substitution positions in the crystal lattice of the surface portion of the semiconductor wafer, which region functions as a gettering site. The reason may be as follows. After irradiation in the form of cluster ions, elements such as carbon and boron are localized at high density at substitution positions and interstitial positions in the silicon single crystal. It has been experimentally found that when carbon or boron are turned into solid solutions to the equilibrium concentration of the silicon single crystal or higher, the solid solubility of heavy metals (saturation solubility of transition metal) extremely increases. It is considered that carbon or boron made into solid solutions to the equilibrium concentration or higher increases the solubility of heavy metals, which results in significantly increased rate of trapping the heavy metals.

Here, since irradiation with the cluster ions 16 is performed in the present invention, higher gettering capability can be achieved as compared to cases of implanting single ions, and recovery heat treatment can be omitted. Therefore, the semiconductor epitaxial wafers 100 and 200 achieving higher gettering capability can be more efficiently produced, and even less white spot defects occur in back-illuminated solid-state image sensing devices produced from the semiconductor epitaxial wafers 100 and 200 obtained by the producing methods. Note that "cluster ions" herein mean clusters formed by aggregation of a plurality of atoms or molecules, which are ionized by being positively or negatively charged. A cluster is a bulk aggregate having a plurality (typically 2 to 2000) of atoms or molecules bound together.

The inventors of the present invention consider the operation achieving such an effect as follows.

Figure 3:
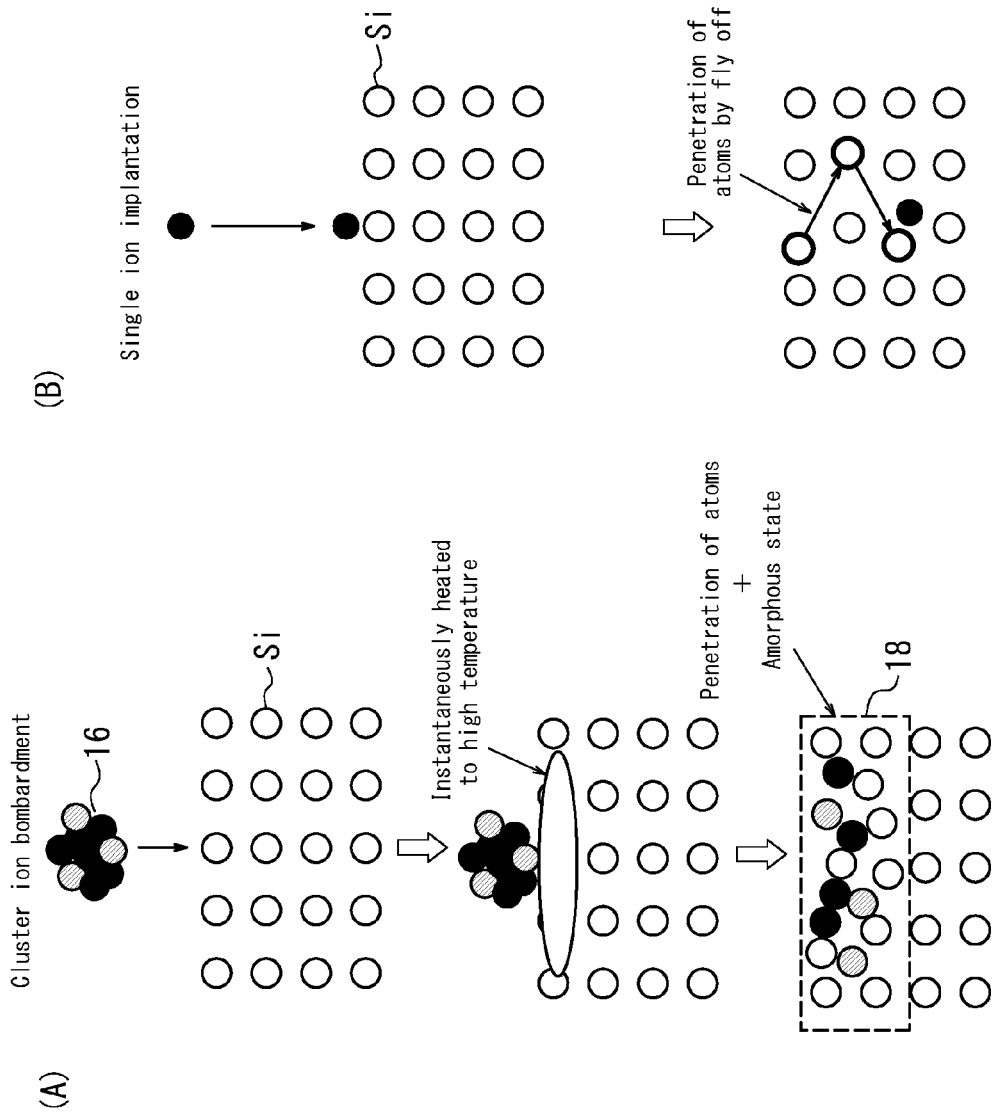
FIG. 3(A) is a schematic view illustrating the irradiation mechanism for irradiation with cluster ions.
FIG. 3(B) is a schematic view illustrating the implantation mechanism for implantation with single ions.

For example, when carbon single ions are implanted into a silicon wafer, the single ions sputter silicon atoms forming the silicon wafer to be implanted to a predetermined depth position in the silicon wafer, as shown in FIG. 3(B). The implantation depth depends on the kind of the constituent element of the implantation ions and the acceleration voltage of the ions. In this case, the concentration profile of carbon in the depth direction of the silicon wafer is relatively broad, and the carbon implanted region extends approximately 0.5 μm to 1 μm. When implantation is performed simultaneously with a plurality of species of ions at the same energy, lighter elements are implanted more deeply, in other words, elements are implanted at different positions depending on their masses. Accordingly, the concentration profile of the implanted elements is broader in such a case. Further, in the formation of an epitaxial layer after ion implantation, the implanted elements are diffused due to heat, which is also a factor of the broader concentration profile.

Single ions are typically implanted at an acceleration voltage of about 150 keV to 2000 keV. However, since the ions collide with silicon atoms with the energy, which results in disrupted crystallinity of the surface portion of the silicon wafer, to which the single ions are implanted. Accordingly, the crystallinity of an epitaxial layer to be grown later on the wafer surface is disrupted. Further, the higher the acceleration voltage is, the more the crystallinity is disrupted. Therefore, it is required to perform heat treatment for recovering the crystallinity having been disrupted at a high temperature for a long time after ion implantation (recovery heat treatment).

On the other hand, when cluster ions formed from, for example, carbon and boron are irradiated into a silicon wafer as shown in FIG. 3(A), the cluster ions 16 are instantaneously turned into a high temperature state of about 1350° C. to 1400° C. due to the irradiation energy, thus melting silicon. After that, the silicon is rapidly cooled to form solid solutions of carbon and boron in the vicinity of the surface of the silicon wafer. Accordingly, a "modifying layer" herein means a layer in which the constituent element of the ion used for irradiation forms a solid solution at crystal interstitial positions or substitution positions in the crystal lattice of the surface portion of the semiconductor wafer. When the concentration profile of the constituent element in the depth direction of the silicon wafer is measured using SIMS, the "modifying layer" is also specified as a zone where the constituent element is detected more in the background. The concentration profile of carbon and boron in the depth direction of the silicon wafer is sharper as compared with the case of single ions, although depending on the acceleration voltage and the cluster size of the cluster ions. The region where carbon and boron are irradiated is a region of 500 nm or less (for example, about 50 nm to 400 nm). Further, as compared with monomer ions, since the ions to be irradiated form clusters, the cluster ions are not channeled through the crystal lattice, and thermal diffusion of constituent elements is suppressed, which leads to the sharp concentration profile. Consequently, carbon and boron are precipitated at a high concentration in a localized region. Since the modifying layer 18 is formed in the vicinity of the surface of the silicon wafer, further proximity gettering can be performed. This is considered to result in achievement of still higher gettering capability. Note that, when irradiation is performed simultaneously with a plurality of species of ions in the form of cluster ions, these ions are not implanted to different depths, which is preferable because the constituent element of the irradiated ions can be located in the vicinity of the surface.

In general, irradiation with cluster ions is performed at an acceleration voltage of about 10 keV/Cluster to 100 keV/Cluster. However, since a cluster is an aggregate of a plurality of atoms or molecules, the ions can be irradiated at reduced energy per one atom or one molecule, which reduces damage to the crystals in the semiconductor wafer. Further, cluster ion irradiation does not disrupt the crystallinity of a semiconductor wafer as compared with single-ion implantation also due to the above described implantation mechanism. Accordingly, after the first step, without performing recovery heat treatment on the semiconductor wafer 10, the semiconductor wafer 10 can be transferred into an epitaxial growth apparatus to be subjected to the second step.

The cluster ions 16 may include a variety of clusters depending on the binding mode, and can be generated, for example, by known methods described in the following documents. Methods of generating gas cluster beam are described in (1) JP 09-041138 A and (2) JP 04-354865 A. Methods of generating ion beam are described in (1) Junzo Ishikawa, "Charged particle beam engineering", ISBN 978-4-339-00734-3 CORONA PUBLISHING, (2) The Institution of Electrical Engineers of Japan, "Electron/Ion Beam Engineering", Ohmsha, ISBN 4-88686-217-9, and (3) "Cluster Ion Beam—Basic and Applications", THE NIKKAN KOGYO SHIMBUN, ISBN 4-526-05765-7. In general, a Nielsen ion source or a Kaufman ion source is used for generating positively charged cluster ions, whereas a high current negative ion source using volume production is used for generating negatively charged cluster ions.

The conditions for irradiation with cluster ions will be described below. First, examples of the element used for irradiation include, but not limited to, carbon, boron, phosphorus, and arsenic. However, in terms of achieving higher gettering capability, the cluster ions preferably contain carbon as a constituent element. Carbon atoms at a lattice site have a smaller covalent radius than silicon single crystals, so that a compression site is produced in the silicon crystal lattice, which results in high gettering capability for attracting impurities in the lattice.

Further, the cluster ions preferably contain at least two kinds of elements including carbon as constituent elements. Since the kinds of metals to be efficiently gettered depend on the kinds of the precipitated elements, solid solutions of two or more kinds of elements can cover a wider variety of metal contaminations. For example, carbon can efficiently getter nickel, whereas boron can efficiently getter copper and iron.

The compounds to be ionized are not limited in particular, but examples of compounds to be suitably ionized include ethane, methane, propane, benzyl gas ($C_7H_7$), and carbon dioxide ($CO_2$) as carbon sources, and diborane and decaborane gas ($B_{10}H_{14}$) as boron sources. For example, when a mixed gas of benzyl gas and decaborane gas is used as a material gas, a hydrogen compound cluster in which carbon, boron, and hydrogen are aggregated can be produced. Alternatively, when cyclohexane ($C_6H_{12}$) is used as a material gas, cluster ions formed from carbon and hydrogen can be produced.

Next, the acceleration voltage and the cluster size of the cluster ions are controlled, thereby controlling the peak position of the concentration profile of the constituent elements in the depth direction of the modifying layer 18. "Cluster size" herein means the number of atoms or molecules constituting one cluster.

In the first step of this embodiment, in terms of achieving higher gettering capability, the irradiation with the cluster ions 16 is performed such that the peak of the concentration profile of the constituent elements in the depth direction of the modifying layer 18 lies at a depth within 150 nm from the surface of the semiconductor wafer 10. Note that in this specification, "the concentration profile of the constituent elements in the depth direction" in the case where the constituent elements include at least two kinds of elements, means the profiles with respect to the respective single element but not with respect to the total thereof.

For a condition required to set the peak positions to the depth level, the acceleration voltage of the cluster ions is set at higher than 0 keV/Cluster and less than 100 keV/Cluster, preferably at 80 keV/Cluster or less, and more preferably 60 keV/Cluster or less. Further, the cluster size is 2 to 100, preferably 60 or less, more preferably 50 or less.

In addition, for adjusting the acceleration voltage, two methods of (1) electrostatic field acceleration and (2) oscillating field acceleration are commonly used. The former method includes a method in which a plurality of electrodes are arranged at regular intervals, and the same voltage is applied therebetween, thereby forming constant acceleration fields in the direction of the axes. The latter method includes a linear acceleration (linac) method in which ions are transferred along a straight line and accelerated with high-frequency waves. The cluster size can be adjusted by controlling the pressure of gas ejected from a nozzle, the pressure of vacuum vessel, the voltage applied to the filament in the ionization, and the like. The cluster size is determined by finding the cluster number distribution by mass spectrometry using the oscillating quadrupole field or by time-of-flight mass spectrometry, and finding the mean value of the cluster numbers.

The dose of the cluster ions can be adjusted by controlling the ion irradiation time. In this embodiment, the cluster dose is $1\times10^{13}$ atoms/$cm^2$ to $1\times10^{16}$ atoms/$cm^2$, preferably $5\times10^{13}$ atoms/$cm^2$ or less. In a case of a dose of less than $1\times10^{13}$ atoms/$cm^2$, sufficient gettering capability would not be achieved, whereas a dose exceeding $1\times10^{16}$ atoms/$cm^2$ would cause great damage to the epitaxial surface.

According to this embodiment, as described above, it is not required to perform recovery heat treatment using a rapid heating/cooling apparatus separate from the epitaxial apparatus, such as RTA/RTO. This is because the crystallinity of the semiconductor wafer 10 can be sufficiently recovered by hydrogen baking performed prior to epitaxial growth in an epitaxial apparatus for forming the epitaxial layer 20 to be described below. For the conditions for hydrogen baking, the epitaxial growth apparatus has a hydrogen atmosphere inside and it is heated from about 1100° C. to 1115° C. to a temperature of 1120° C. to 1150° C. at a rate of 1° C./s to 15° C./s, and the temperature is maintained for 30 s to 1 min.

Needless to say, the recovery heat treatment may be performed using a rapid heating/cooling apparatus separate from the epitaxial apparatus after the first step prior to the second step. Even in this case, the crystallinity can be sufficiently recovered under the conditions of 1000° C. or less and less than 10 s which is shorter than conventional.

A silicon epitaxial layer can be given as an example of the second epitaxial layer 20 formed on the modifying layer 18, and the silicon epitaxial layer can be formed under tyipical conditions. For example, a source gas such as dichlorosilane or trichlorosilane can be introduced into a chamber using hydrogen as a carrier gas, so that the source material can be epitaxially grown on the semiconductor wafer 10 by CVD at about 1000° C. to 1150° C. The epitaxial layer 20 preferably has a thickness in the range of 1 μm to 10 μm, more preferably in the range of 3 μm to 5 μm. When the thickness is less than 1 μm, the resistivity of the second epitaxial layer 20 would change due to out-diffusion of dopants from the semiconductor wafer 10, whereas a thickness exceeding 10 μm would affect the spectral sensitivity characteristics of the solid-state image sensing device. The second epitaxial layer 20 is used as a device layer for producing a back-illuminated solid-state image sensing device.

Figure 2:
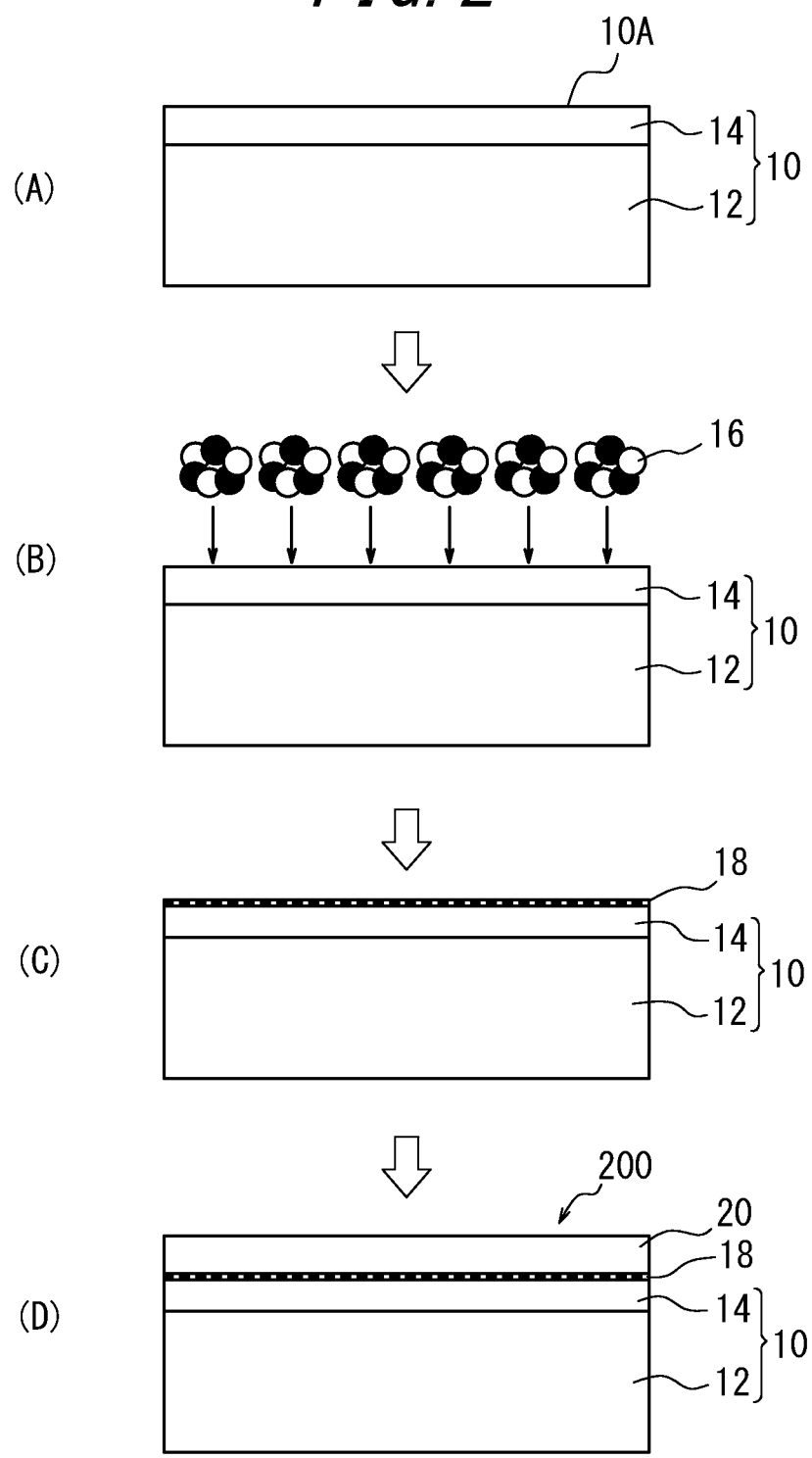
FIGS. 2(A) to 2(D) are schematic cross-sectional views illustrating a method of producing a semiconductor epitaxial wafer 200 according to another embodiment of the present invention.

The second embodiment shown in FIG. 2 has a feature in that not the bulk semiconductor wafer 12 but the first epitaxial layer 14 is irradiated with cluster ions. The bulk semiconductor wafer has an oxygen concentration two orders of magnitude higher than that of the epitaxial layer. Accordingly, a larger amount of oxygen is diffused in the modifying layer formed in the bulk semiconductor wafer than in the modifying layer formed in the epitaxial layer, and the former modifying layer traps a large amount of oxygen. The trapped oxygen is released from the gettering site in a device fabrication process and diffused into an active region of the device to form point defects. This affects electrical characteristics of the device. Therefore, one important design condition in the device fabrication process is to ion-irradiate an epitaxial layer having low solute oxygen concentration and to form a gettering layer in the epitaxial layer in which the effect of oxygen diffusion is almost negligible.

(Semiconductor Epitaxial Wafer)

Next, semiconductor epitaxial wafers 100 and 200 produced according to the above methods will be described. A semiconductor epitaxial wafer 100 according to the first embodiment and a semiconductor epitaxial wafer 200 according to the second embodiment each has a semiconductor wafer 10, a modifying layer 18 formed from a certain element contained as a solid solution in the semiconductor wafer 10, in a surface portion of the semiconductor wafer 10, and an epitaxial layer 20 on this modifying layer 18 as shown in FIG. 1(C) and FIG. 2(D). Both of them characteristically have a concentration profile of the certain element in the depth direction of the modifying layer 18, having a half width W of 100 nm or less. Specifically, according to the producing method of the present invention, the element constituting cluster ions can be precipitated at a high concentration in a localized region as compared with single-ion implantation, which results in the half width W of 100 nm or less. Further, in terms of achieving higher gettering capability, the half width W is preferably 85 nm or less, preferably the lower limit thereof is set to 10 nm. Note that "concentration profile in the depth direction" herein means a concentration distribution in the depth direction, which is measured with a SIMS (secondary ion mass spectrometer).

The certain element is not limited in particular as long as it is an element other than the main material of a semiconductor wafer (silicon when the semiconductor wafer is a silicon wafer). However, carbon or at least two kinds of elements containing carbon are preferable as described above.

In terms of achieving higher gettering capability, for both of the semiconductor epitaxial wafers 100 and 200, the peak of the concentration profile in the modifying layer 18 lies at a depth within 150 nm from the surface of the semiconductor wafer 10. Further, the peak concentration of the concentration profile is preferably $1 \times 10^{15}$ atoms/cm$^3$ or more, more preferably in the range of $1 \times 10^{17}$ atoms/cm$^3$ to $1 \times 10^{22}$ atoms/cm$^3$, still more preferably in the range of $1 \times 10^{19}$ atoms/cm$^3$ to $1 \times 10^{21}$ atoms/cm$^3$.

The thickness of the modifying layer 18 in the depth direction is defined as the thickness of a region at depths where a concentration higher than the background is detected in the above concentration profile, and can be in the range of 30 nm to 400 nm.

According to the semiconductor epitaxial wafers 100 and 200 of this embodiment, higher gettering capability can be achieved than conventional, which makes it possible to further suppress metal contamination.

(Method of Producing Solid-State Image Sensing Device)

In a method of producing a solid-state image sensing device according to an embodiment of the present invention, a solid-state image sensing device can be formed on an epitaxial wafer produced according to the above producing methods or on the above epitaxial wafer, specifically, on the epitaxial layer 20 located in the surface portion of the semiconductor epitaxial wafers 100 and 200. In solid-state image sensing devices obtained by this producing method, formation of white spot defects can be sufficiently suppressed than conventional.

Representative embodiments of the present invention have been described above. However, the present invention is not limited on those embodiments. For example, two layers of epitaxial layers may be formed on the semiconductor wafer 10.

EXAMPLES

Experimental Example 1

Example 1-1

An n-type silicon wafer (thickness: 725 μm, kind of dopant: phosphorus, dopant concentration: $1 \times 10^{15}$ atoms/cm$^3$) obtained from a CZ crystal was prepared. Next, cluster ions were generated using a cluster ion generator (CLARIS produced by Nissin Ion Equipment Co., Ltd.) under the conditions shown in Table 1, and the silicon wafer was irradiated with the cluster ions. After that, recovery heat treatment under the conditions shown in Table 1 was performed using an RTA apparatus (produced by Mattson Thermal Products GmbH) as a heat treatment sufficient for recovering the crystallinity disrupted by the irradiation with cluster ions. Subsequently, the silicon wafer was transferred into a single wafer processing epitaxial growth apparatus (produced by Applied Materials, Inc.) and subjected to hydrogen baking at 1120° C. for 30 s in the apparatus. A silicon epitaxial layer (thickness: 4 µm, kind of dopant: phosphorus, dopant concentration: $1\times10^{15}$ atoms/cm$^3$) was then epitaxially grown on the silicon wafer by CVD at 1150° C. using hydrogen as a carrier gas and dichlorosilane as a source gas, thereby obtaining a silicon epitaxial wafer of the present invention.

Examples 1-2 to 1-4

Silicon epitaxial wafers in accordance with the present invention were prepared in the same manner as Example 1-1 except that the cluster ion irradiation conditions and the recovery heat treatment conditions were changed as shown in Table 1. In Examples 1-2 and 1-4, recovery heat treatment using an RTA apparatus was not performed. The irradiation with cluster ions was performed at 80 keV/Cluster in Examples 1-1 to 1-4. The clusters each include three carbon atoms (atomic weight: 12) and three hydrogen atoms (atomic weight: 1). Therefore, the energy received by one carbon atom was $80\times\{12\times3/(12\times3+1\times3)\}/3=24.6$ keV.

Comparative Examples 1-1 and 1-2

Silicon epitaxial wafers according to Comparative Examples were prepared in the same manner as Examples above except that a single-ion implantation step was performed under the conditions shown in Table 1 instead of the step of irradiation with cluster ions. Note that each single ion is implanted into the silicon wafer at an energy of 100 keV in Comparative Examples 1-1 and 1-2.

<Evaluation Method and Evaluation Result>

The samples prepared in Examples and Comparative Examples above were evaluated. The evaluation methods are shown below.

(1) SIMS Measurement

Figure 4:
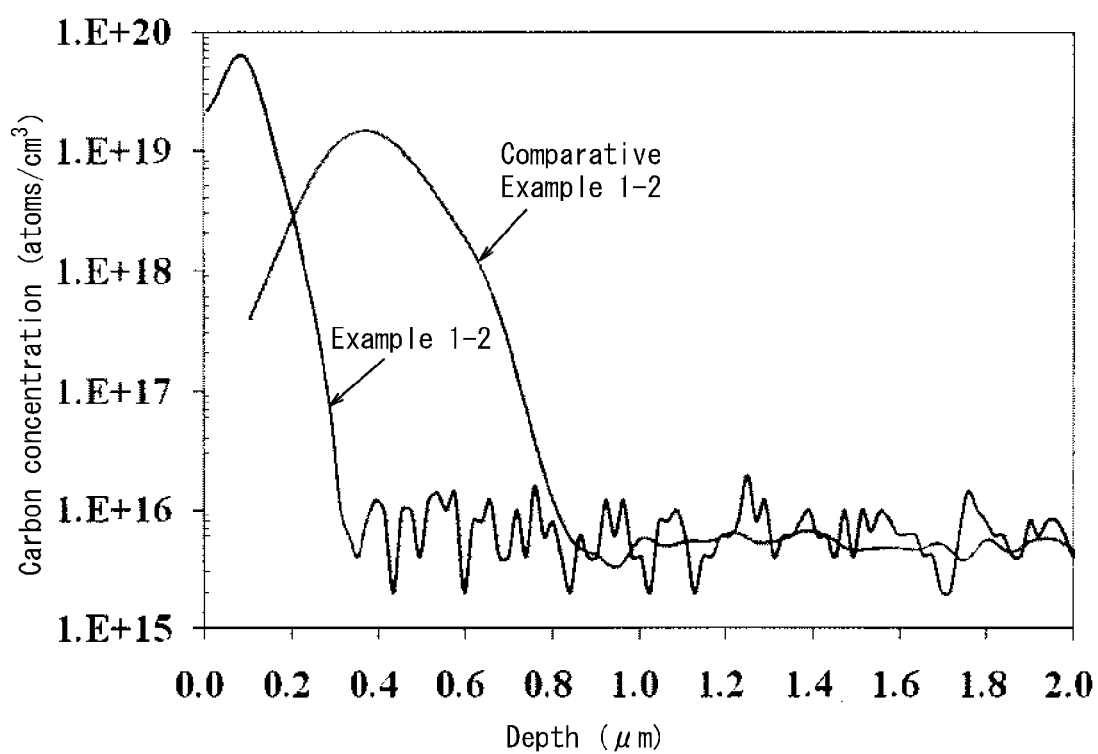
FIG. 4 is a graph showing the distribution of the carbon concentration with respect to the depth from the surface of a silicon wafer (concentration profile) in Example 1-2 and Comparative Example 1-2.

The samples prepared in Examples and Comparative Examples above were subjected to secondary ion mass spectrometry (SIMS) to obtain the concentration profile of the implanted elements. The concentration profiles of carbon in Example 1-2 and Comparative Example 1-2 of the same dose are shown as representative measurement results in FIG. 4. Note that the horizontal axis corresponds to the depth from the surface of the silicon wafer. In Example 1-2, the half width was 83.3 nm, and the peak concentration was $5.83\times10^{19}$ atoms/cm$^3$. Meanwhile, in Comparative Example 1-2, the half width was 245.9 nm, and the peak concentration was $1.50\times10^{19}$ atoms/cm$^3$. The values of the half widths and the peak concentrations of the other Examples and Comparative Example are shown in Table 1. Further, the peak depths are also shown in Table 1.

(2) Evaluation of Gettering Capability

The silicon wafer surface of each sample fabricated in Examples and Comparative Examples was contaminated on purpose by a spin coat contamination method using Ni contaminant liquid and Cu contaminant liquid ($1.0\times10^{12}$/cm$^2$ each) and was then subjected to heat treatment at 900° C. for 30 min. After that, a SIMS measurement was performed. The Ni concentration profiles (FIG. 5) and the Cu concentration profiles (FIG. 6) of Example 1-2 and Comparative Example 1-2 are shown with the C concentration profiles thereof as representative measurement results.

(3) White Spot Defects

Back-illuminated solid-state image sensing devices were fabricated using the samples prepared in Examples and Comparative Examples above. After that, with respect to each of the back-illuminated solid-state image sensing devices, dark leakage current in photoconductor diodes was measured using a semiconductor parameter analyzing system and the results were converted into pixel data (data of the number of white spot defects) to find the number of white spot defects per unit area (1 cm$^2$), thus evaluating the suppression of formation of the white spot defects. The results are shown in Table 1.

(4) Heavy Metal Contamination

The prepared samples were contaminated by a spin coat contamination method using nickel ($1.0\times10^{12}$ atoms/cm$^3$) and subjected to heat treatment at 900° C. for one hour, followed by selective etching of the surfaces of the samples. Thus, the defect densities (number/cm$^2$) of the surfaces of the samples were evaluated. The results are shown in Table 1.

(5) Evaluation of LPD Map

Light point defects (LPDs) of the samples fabricated in Examples and Comparative Examples were detected using a wafer surface inspection system (SP-1 produced by KLA-Tencor Corporation). The LPD maps of Example 1-2 and Comparative Example 1-2 are shown as representative measurement results in FIG. 7. The number of LPDs in other Examples and Comparative Example are shown in Table 1.

TABLE 1

| | Cluster ion irradiation conditions (Example) Single ion implantation conditions (Comparative Example) | | | | | Recovery heat treatment temp./time | SIMS measurement results | | | White spot defect (number/cm$^2$) | Defect density (number/cm$^2$) | LPD (number) |
|---|---|---|---|---|---|---|---|---|---|---|---|---|
| | Element(s) | Source gas | Acceleration voltage (keV/Cluster) | Cluster size (number) | Dose (atoms/cm$^2$) | | Half-width (nm) | Peak concentration (atoms/cm$^3$) | Peak position (nm) | | | |
| Example 1-1 | C, H | C$_6$H$_{12}$ | 80 | C: 3, H: 3 | 5.0E14 | 950° C. × 5 s | 83.6 | 5.75E19 | 80.3 | 0.4 | 1.9 | 2 |
| Example 1-2 | C, H | C$_6$H$_{12}$ | 80 | C: 3, H: 3 | 5.0E14 | — | 83.3 | 5.83E19 | 80.2 | 0.4 | 2.0 | 1 |
| Example 1-3 | C, H | C$_6$H$_{12}$ | 80 | C: 3, H: 3 | 2.7E14 | 950° C. × 5 s | 80.1 | 2.90E19 | 79.8 | 0.6 | 2.5 | 1 |
| Example 1-4 | C, H | C$_6$H$_{12}$ | 80 | C: 3, H: 3 | 2.7E14 | — | 79.9 | 2.95E19 | 79.9 | 0.7 | 2.7 | 1 |
| Comparative Example 1-1 | C | CO$_2$ | 100 | 1 | 5.0E14 | 1000° C. × 1 h | 245.8 | 1.47E19 | 391.5 | 3.1 | 4.0 | 4 |
| Comparative Example 1-2 | C | CO$_2$ | 100 | 1 | 5.0E14 | — | 245.9 | 1.50E19 | 388.9 | 3.5 | 6.0 | 10 |

<Discussion on Evaluation Result>
From the above results, as shown in Table 1, the half width of the concentration profile of the irradiated elements was smaller in Examples than in Comparative Examples. Further, when comparison was made under the same condition of dose as in Example 1-2 and Comparative Example 1-2 (see also FIG. 4), the peak concentrations of Examples were higher than those in Comparative Examples. This shows that irradiation with cluster ions made it possible to form a modifying layer having more localized ions at a higher density as compared with single-ion implantation. Consequently, the following properties were improved.

Figure 5:
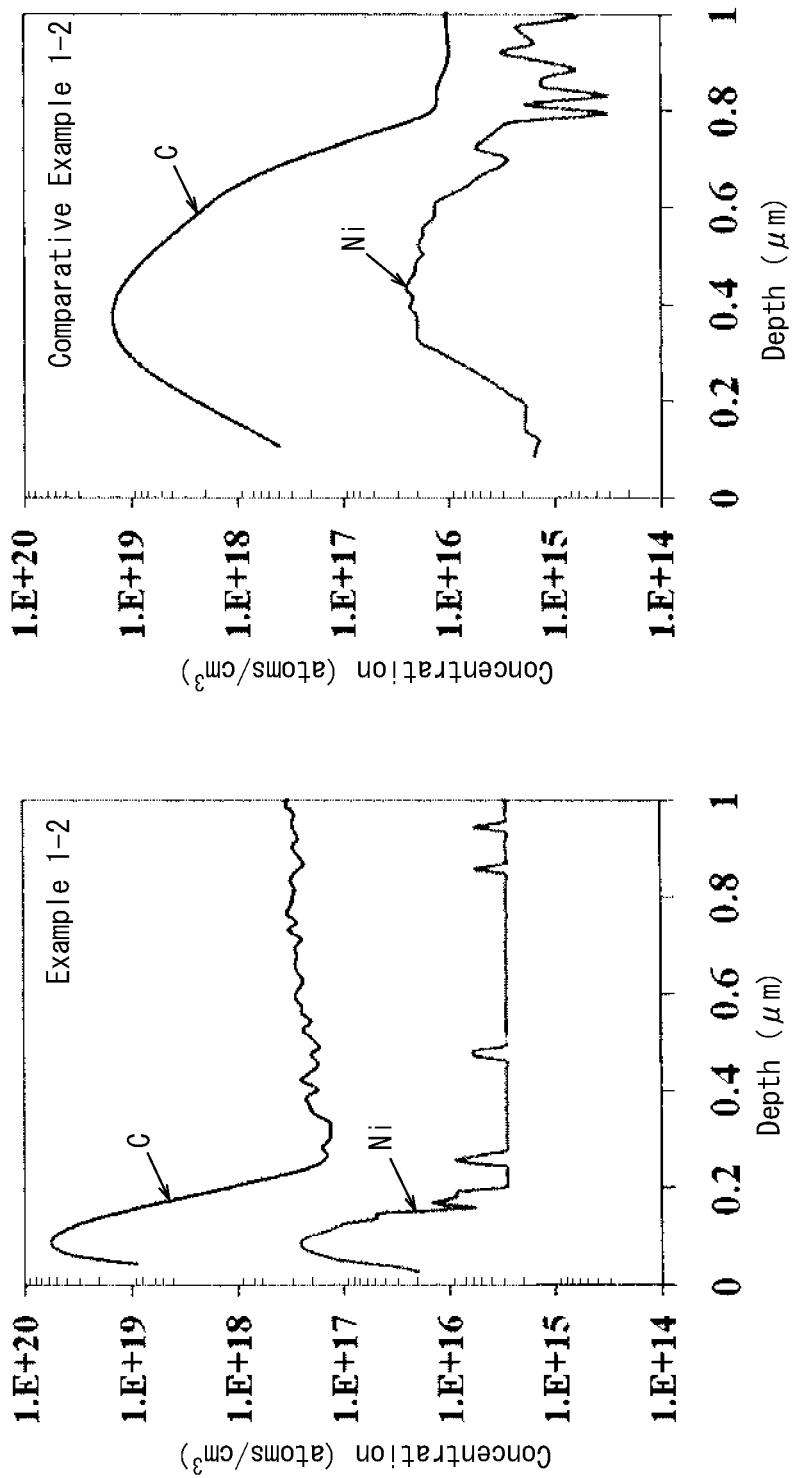
FIG. 5 shows graphs for comparing the Ni gettering capability of Example 1-2 and Comparative Example 1-2.
Figure 6:
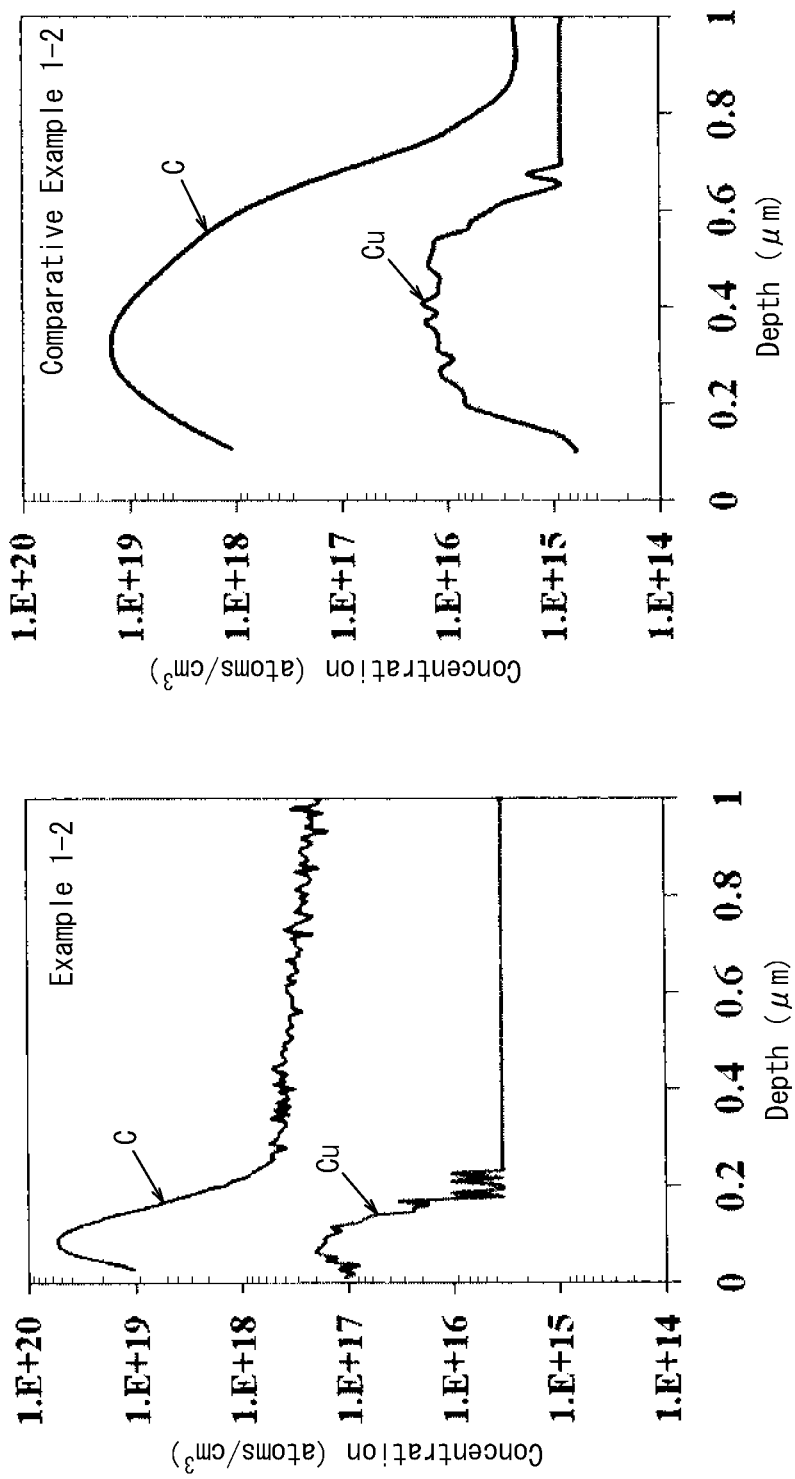
FIG. 6 shows graphs for comparing the Cu gettering capability of Example 1-2 and Comparative Example 1-2.
Figure 8:
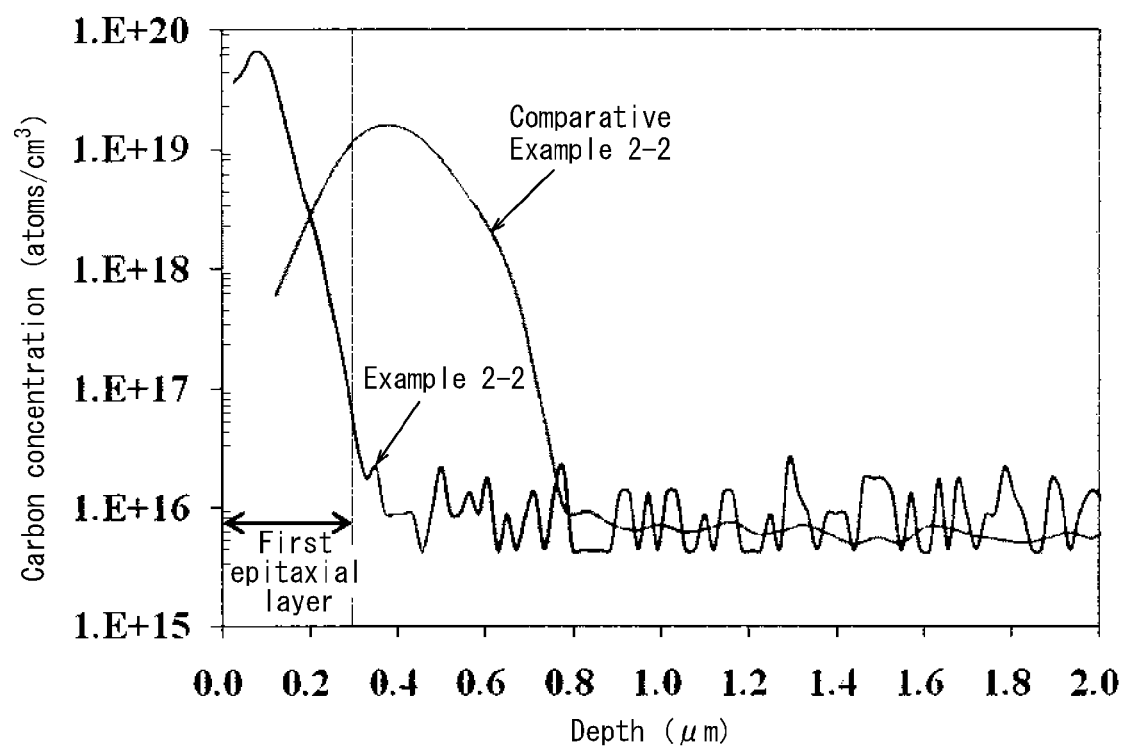
FIG. 8 is a graph showing the distribution of the carbon concentration with respect to the depth from the surface of a silicon wafer (concentration profile) in Example 2-2 and Comparative Example 2-2.
Figure 9:
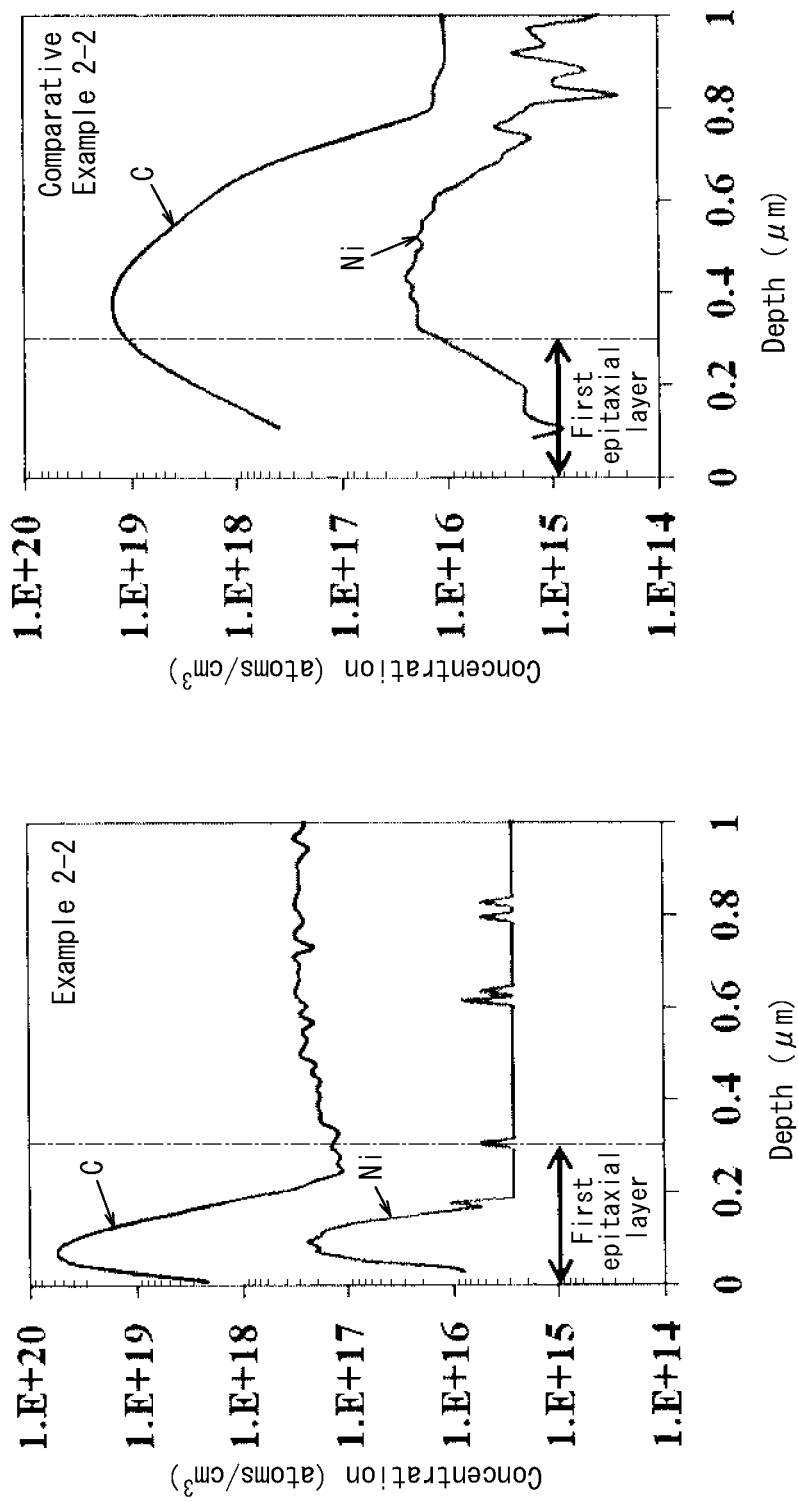
FIG. 9 shows graphs for comparing the Ni gettering capability of Example 2-2 and Comparative Example 2-2.
Figure 10:
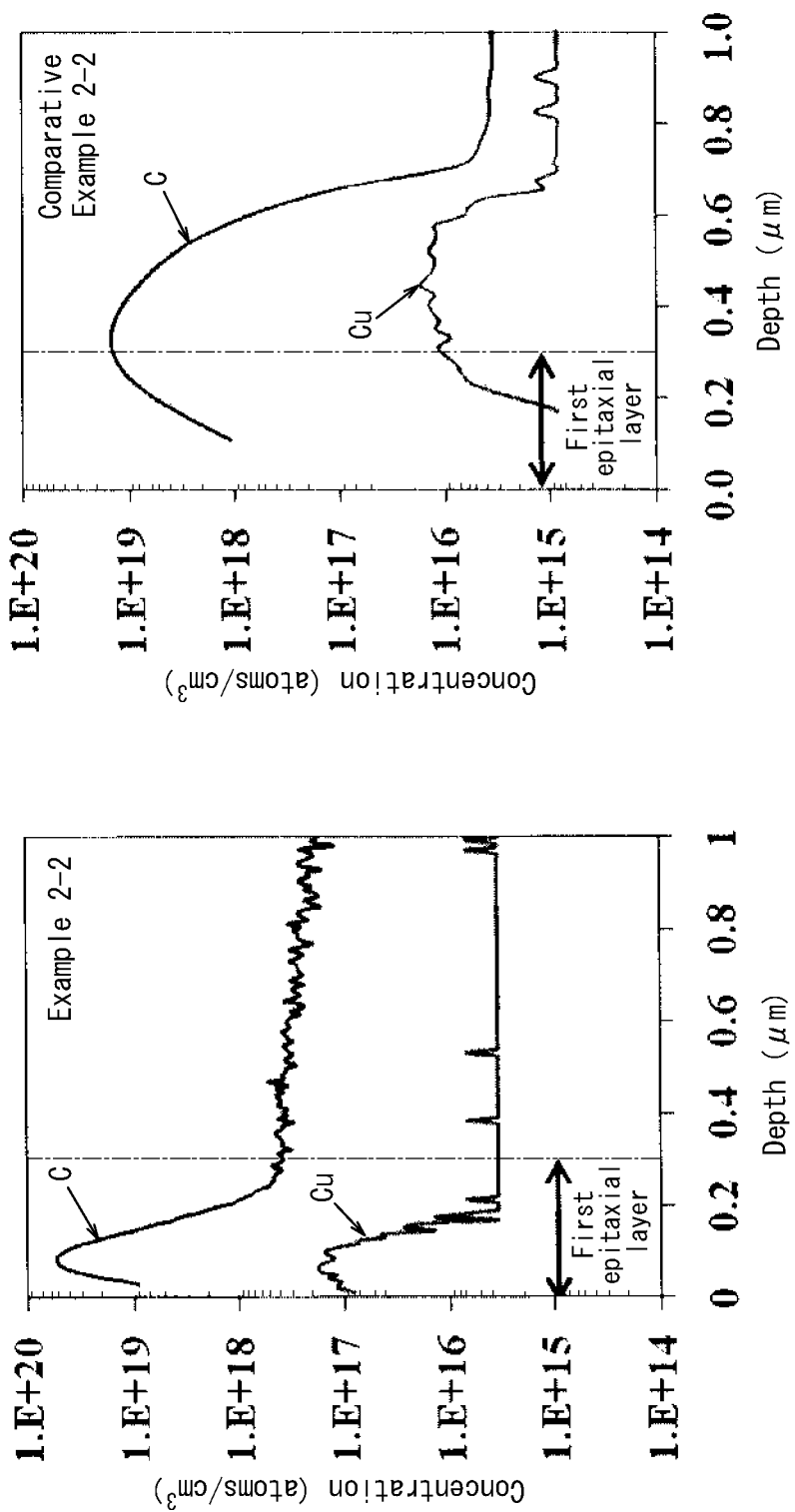
FIG. 10 shows graphs for comparing the Cu gettering capability of Example 2-2 and Comparative Example 2-2.

First, as shown in FIG. 5 and FIG. 6, large amounts of Ni and Cu were trapped by the modifying layer in Examples; meanwhile, the amount gettered is obviously small in Comparative Examples. Thus, it is understood that higher gettering capability was achieved in Examples. Further, Table 1 shows that formation of white spot defects when forming a solid-state image sensing device can be suppressed, defect density can be reduced, and LPDs can be reduced, more in Examples than in Comparative Examples. Further, in Examples, the crystallinity was sufficiently recovered by hydrogen baking using an epitaxial growth apparatus without performing recovery heat treatment using an RTA apparatus. On the other hand, Comparative Examples needed long time recovery heat treatment.

Experimental Example 2

Example 2-1

An n-type silicon wafer (thickness: 725 µm, kind of dopant: phosphorus, dopant concentration: $1\times10^{15}$ atoms/$cm^3$) obtained from a CZ crystal was transferred into a single wafer processing epitaxial growth apparatus (produced by Applied Materials, Inc.) and subjected to hydrogen baking at 1120° C. for 30 s in the apparatus. A first epitaxial layer of silicon (thickness: 0.3 µm, kind of dopant: phosphorus, dopant concentration: $1\times10^{15}$ atoms/$cm^3$) was then epitaxially grown on the wafer by CVD at 1150° C. using hydrogen as a carrier gas and dichlorosilane as a source gas. Next, cluster ions were generated using a cluster ion generator (CLARIS produced by Nissin Ion Equipment Co., Ltd.) under the conditions shown in Table 2, and the first epitaxial layer was irradiated with the cluster ions. After that, recovery heat treatment under the conditions shown in Table 2 was performed using an RTA apparatus (produced by Matt-son Thermal Products GmbH) as a heat treatment sufficient for recovering the crystallinity disrupted by the irradiation with the cluster ions. The silicon wafer was then transferred into the epitaxial growth apparatus again, and a second epitaxial layer was formed on the first epitaxial layer under the same conditions as the first epitaxial layer, thereby obtaining a silicon epitaxial wafer in accordance with the present invention.

Examples 2-2 to 2-4

Silicon epitaxial wafers in accordance with the present invention were prepared in the same manner as Example 2-1 except that the cluster ion irradiation conditions and the recovery heat treatment conditions were changed as shown in Table 2. In Examples 2-2 and 2-4, recovery heat treatment using an RTA apparatus was not performed. Note that the energy received by one carbon atom was 24.6 keV in Examples 2-1 to 2-4.

Comparative Examples 2-1 and 2-2

Silicon epitaxial wafers according to Comparative Examples were prepared in the same manner as Examples above except that a single-ion implantation step was performed under the conditions shown in Table 2 instead of the step of irradiation with cluster ions. Note that each single ion is implanted into the silicon wafer at an energy of 100 keV in Comparative Examples 2-1 and 2-2.

<Evaluation Method and Evaluation Result>
The samples prepared in Examples and Comparative Examples above were subjected to the same five evaluations performed in Example 1, and the results are shown in Table 2 and FIGS. 8 to 11.

TABLE 2

| | Cluster ion irradiation conditions (Example) Single ion implantation conditions (Comparative Example) | | | | | Recovery heat treatment temp./time | Evaluation results | | | | | |
|---|---|---|---|---|---|---|---|---|---|---|---|---|
| | | | | | | | SIMS measurement results | | | White spot defect density (number/$cm^2$) | Defect density (number/$cm^2$) | LPD (number) |
| | Element(s) | Source gas | Acceleration voltage (keV/Cluster) | Cluster size (number) | Dose (atoms/$cm^2$) | | Half-width (nm) | Peak concentration (atoms/$cm^3$) | Peak position (nm) | | | |
| Example 2-1 | C, H | $C_6H_{12}$ | 80 | C: 3, H: 3 | 5.0E14 | 950° C. × 5 s | 84.9 | 5.78E19 | 80.4 | 0.4 | 1.9 | 3 |
| Example 2-2 | C, H | $C_6H_{12}$ | 80 | C: 3, H: 3 | 5.0E14 | — | 84.7 | 5.74E19 | 80.3 | 0.5 | 2.0 | 2 |
| Example 2-3 | C, H | $C_6H_{12}$ | 80 | C: 3, H: 3 | 2.7E14 | 950° C. × 5 s | 79.9 | 2.94E19 | 80.3 | 0.7 | 2.5 | 1 |
| Example 24 | C, H | $C_6H_{12}$ | 80 | C: 3, H: 3 | 2.7E14 | — | 79.6 | 2.97E19 | 80.1 | 0.7 | 2.6 | 1 |
| Comparative Example 2-1 | C | $CO_2$ | 100 | 1 | 5.0E14 | 1000° C. × 1 h | 246.8 | 1.48E19 | 373.8 | 3.4 | 4.2 | 5 |
| Comparative Example 2-2 | C | $CO_2$ | 100 | 1 | 5.0E14 | — | 247.3 | 1.51E19 | 368.4 | 3.7 | 6.7 | 13 |

Thus, the like results were obtained in Experimental Example 1 where the bulk silicon wafer was irradiated with the cluster ions and in Experimental Example 2 where the epitaxial layer was irradiated with the cluster ions.

INDUSTRIAL APPLICABILITY

The present invention can provide a method of more efficiently producing a semiconductor epitaxial wafer, which can suppress metal contamination by achieving higher gettering capability.

REFERENCE SIGNS LIST

100, 200: Semiconductor epitaxial wafer
10: Semiconductor wafer
10A: Surface portion of semiconductor wafer
12: Bulk semiconductor wafer
14: First epitaxial layer
16: Cluster ions
18: Modifying layer
20: Second epitaxial layer

The invention claimed is:

1. A semiconductor epitaxial wafer, comprising:
a semiconductor wafer whose material is composed of semiconductor material;
a modifying layer formed from a certain element contained as a solid solution in the semiconductor wafer, in a surface portion of the semiconductor wafer; and
an epitaxial layer on the modifying layer,
wherein the half width of a concentration profile of the certain element in the depth direction of the modifying layer is 100 nm or less.

2. The semiconductor epitaxial wafer according to claim 1, wherein the semiconductor wafer is a silicon wafer.

3. The semiconductor epitaxial wafer according to claim 1, wherein the semiconductor wafer is an epitaxial silicon wafer in which a silicon epitaxial layer is formed on a surface of a silicon wafer, and the modifying layer is located in a surface portion of the silicon epitaxial layer.

4. The semiconductor epitaxial wafer according to claim 3, wherein the certain element contains carbon.

5. The semiconductor epitaxial wafer according to claim 1, wherein the peak of the concentration profile in the modifying layer lies at a depth within 150 nm from the surface of the semiconductor wafer.

6. The semiconductor epitaxial wafer according to claim 1, wherein the peak concentration of the concentration profile in the modifying layer is $1 \times 10^{15}$ atoms/cm$^3$ or more.

7. The semiconductor epitaxial wafer according to claim 1, wherein the certain element includes carbon.

8. The semiconductor epitaxial wafer according to claim 7, wherein the certain element includes at least two kinds of elements including carbon.

9. A semiconductor epitaxial wafer, comprising:
a semiconductor wafer whose material is composed of semiconductor material;
a modifying layer formed from a certain element contained as a solid solution in the semiconductor wafer, in a surface portion of the semiconductor wafer; and
an epitaxial layer on the modifying layer,
wherein a concentration of the certain element in the modifying layer is described by a profile of the concentration plotted versus depth of the modifying layer, wherein a width of the profile is 100 nm or less where the concentration is half of a peak concentration.

* * * * *